(12) United States Patent
An et al.

(10) Patent No.: US 12,740,260 B2
(45) Date of Patent: Sep. 15, 2026

(54) TFT SUBSTRATE, DISPLAY MODULE, AND ELECTRONIC DEVICE

(71) Applicant: Honor Device Co., Ltd., Shenzhen (CN)

(72) Inventors: Yabin An, Shenzhen (CN); Yi Su, Shenzhen (CN); Haiming He, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 420 days.

(21) Appl. No.: 17/918,034

(22) PCT Filed: May 26, 2022

(86) PCT No.: PCT/CN2022/095339
§ 371 (c)(1),
(2) Date: Oct. 10, 2022

(87) PCT Pub. No.: WO2023/020059
PCT Pub. Date: Feb. 23, 2023

(65) Prior Publication Data

US 2024/0215347 A1 Jun. 27, 2024

(30) Foreign Application Priority Data

Aug. 20, 2021 (CN) ......................... 202110962861.8
Oct. 22, 2021 (CN) ......................... 202111234925.9

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC ............. H10K 59/131; H10K 59/1213; H10K 59/123; H10D 30/6734; H10D 86/423; H10D 86/60; H10D 86/471; H10D 86/441
See application file for complete search history.

(56) References Cited

U.S. PATENT DOCUMENTS 7,655,560 B2 * 2/2010 Kurokawa .......... H01L 23/4824 438/638
8,436,359 B2 * 5/2013 Akimoto ................ H10B 20/65 257/E29.202

(Continued)

FOREIGN PATENT DOCUMENTS

CN 106057820 A 10/2016
CN 108089382 A 5/2018

(Continued)

*Primary Examiner* — Tan N Tran
(74) *Attorney, Agent, or Firm* — Conley Rose, P.C.

(57) ABSTRACT

Embodiments of this application provide a TFT substrate, a display module, and an electronic device. The TFT substrate includes a base, a first active layer, a first source drain layer, a first gate, a plurality of data lines, and a wiring layer. The wiring layer is disposed on a side that is of the first source drain layer and that is away from the base. The wiring layer includes a plurality of first metal wires. One end of each of the plurality of first metal wires is coupled to each of the plurality of data lines, and the other end of each of the plurality of first metal wires is used to be coupled to a display driver chip.

19 Claims, 13 Drawing Sheets

(56) References Cited

U.S. PATENT DOCUMENTS

| | | | |
|---|---|---|---|
| 8,441,013 | B2 | 5/2013 | Hirato et al. |
| 10,216,052 | B2 * | 2/2019 | Shin ...................... G02F 1/1368 |
| 10,755,608 | B2 | 8/2020 | Song et al. |
| 10,777,587 | B2 | 9/2020 | Nishimura et al. |
| 11,494,030 | B2 * | 11/2022 | Choo .................. G06F 3/04184 |
| 2014/0146260 | A1 | 5/2014 | Lee |
| 2014/0284574 | A1 | 9/2014 | Hong et al. |
| 2019/0278145 | A1 | 9/2019 | Tanaka et al. |
| 2020/0090559 | A1 | 3/2020 | Song et al. |
| 2021/0013297 | A1 * | 1/2021 | Okabe ....................... G09F 9/30 |
| 2022/0037447 | A1 | 2/2022 | Cho et al. |
| 2023/0043145 | A1 | 2/2023 | Yuan et al. |
| 2024/0138212 | A1 * | 4/2024 | Saitoh ....................... G09F 9/30 |
| 2024/0379655 | A1 | 11/2024 | Long et al. |

FOREIGN PATENT DOCUMENTS

| | | | |
|---|---|---|---|
| CN | 109541865 | A | 3/2019 |
| CN | 109791745 | A | 5/2019 |
| CN | 110047845 | A | 7/2019 |
| CN | 110286534 | A | 9/2019 |
| CN | 110911444 | A | 3/2020 |
| CN | 111653603 | A | 9/2020 |
| CN | 112216721 | A | 1/2021 |
| CN | 112310125 | A | 2/2021 |
| CN | 112703606 | A | 4/2021 |
| EP | 3703125 | A1 | 9/2020 |
| EP | 3852146 | A1 | 7/2021 |

* cited by examiner

TFT SUBSTRATE, DISPLAY MODULE, AND ELECTRONIC DEVICE

CROSS-REFERENCE TO RELATED APPLICATIONS

This application is a U.S. National Stage of International Application No. PCT/CN2022/095339 filed on May 26, 2022, which claims priority to Chinese Patent Application No. 202110962861.8, filed with the China National Intellectual Property Administration on Aug. 20, 2021, and claims priority to Chinese Patent Application No. 202111234925.9, filed with the China National Intellectual Property Administration on Oct. 22, 2021, all of which are incorporated herein by reference in their entireties.

TECHNICAL FIELD

This application relates to the field of display technologies, and in particular, to a TFT substrate, a display module, and an electronic device.

BACKGROUND

With continuous development of a full screen technology, a requirement on a screen-to-body ratio of an electronic device is increasingly high. Generally, the electronic device includes a display module configured to display an image. The display module may include an active area (active area, AA) and a non-active area around the active area AA.

Generally, the non-active area includes a peripheral drive circuit (for example, a scan circuit providing a scan signal, or a display driver chip). To increase the screen-to-body ratio, a size of the non-active area needs to be compressed. The size of the non-active area may be compressed by compressing the scan circuit, or by using a waterfall screen or a curved screen, to change the non-active area from a horizontal direction to a vertical direction. However, as shown in FIG. 1, a lower fanout (fanout) area further exists between the active area AA and the display driver chip. The lower fanout area couples, in a fanout manner, the display driver chip to a data line (data line, DL) in the active area AA, to provide an image signal to the active area AA. A size of the lower fanout area cannot be reduced through compression or bending. Therefore, a size of a non-active area at a lower frame of the electronic device is relatively large, which greatly affects an increase in the screen-to-body ratio of the electronic device.

SUMMARY

Embodiments of this application provide a TFT substrate, a display module, and an electronic device, to resolve a problem that a non-active area of the electronic device is relatively large, so as to improve a screen-to-body ratio of the electronic device.

To achieve the foregoing objective, the following technical solutions are used in the embodiments of this application:

According to a first aspect, this application provides a TFT substrate. The TFT substrate has a plurality of sub-pixels arranged in rows and columns. The TFT substrate includes a base, a first active layer, a first source drain layer, a first gate, a plurality of data lines, and a wiring layer. The first active layer is disposed on a side of the base, and each sub-pixel includes the first active layer. The first source drain layer is disposed on a side that is of the first active layer and that is away from the base. The first source drain layer includes a first source and a first drain in each sub-pixel, and both the first source and the first drain in each sub-pixel are coupled to the first active layer in the sub-pixel. The first gate is disposed in correspondence to the first active layer, and is disposed between the first active layer and the first source drain layer. The plurality of data lines are disposed at the first source drain layer. The plurality of data lines are respectively coupled to the first source or the first drain in a plurality of columns of sub-pixels. A wiring layer is disposed on a side that is of the first source drain layer and that is away from the base. The wiring layer includes a plurality of first metal wires. One end of each of the plurality of first metal wires is coupled to each of the plurality of data lines, and the other end of each of the plurality of first metal wires is used to be coupled to a display driver chip.

Based on the TFT substrate, the wiring layer is disposed in the TFT substrate, may replace a lower fanout area in an active area AA in an electronic device, and is configured to connect the data line and the display driver chip in the TFT substrate, to provide an image signal required for display to the TFT substrate. In this way, fanout in the active area AA may be implemented, so that the lower fanout area of a display module of the electronic device no longer occupies a non-active area, thereby reducing a size of the non-active area and increasing a screen-to-body ratio of the electronic device.

In a possible implementation, different first metal wires among the plurality of first metal wires are separated from each other. It should be understood that the different first metal wires are configured to connect different data lines, so that a display quality problem caused by data crosstalk is avoided, and reliability and stability of the electronic device are improved.

In a possible implementation, the display driver chip is disposed at an edge of a side of the TFT substrate, and the first metal wire extends in an "L" shape. In this way, the different first metal wires among the plurality of first metal wires are separated from each other, and wiring of the first metal wire can be further facilitated.

In a possible implementation, the plurality of first metal wires form a first area on the TFT substrate. The wiring layer further includes a plurality of second metal wires disposed in a second area of the TFT substrate. The second area is an area other than the first area on the TFT substrate. The second metal wire is disconnected from the first metal wire. In this way, after the second metal wire is added to the wiring layer, a problem of display mura due to light reflection of a metal wire (namely, the first metal wire) in the active area AA can be effectively reduced, and display quality of the electronic device is improved. In addition, load of the pixel circuit may be balanced, to improve display quality of the active area AA.

In a possible implementation, different second metal wires among the plurality of second metal wires are separated from each other. In this way, a logical function of each pixel circuit in an entire TFT substrate can be ensured, a display problem caused by crosstalk is avoided, and reliability and stability of the electronic device are improved.

In a possible implementation, the first metal wire extends in an "L" shape. Each second metal wire includes a first sub-wire and a second sub-wire. An extension direction of the first sub-wire is the same as that of one side of the "L" shape of the first metal wire. An extension direction of the second sub-wire is the same as that of the other side of the "L" shape of the first metal wire. In this way, from an overall perspective on the active area AA, an arrangement direction of the first metal wire and that of the second metal wire are the same (that is, in a long-range order), so that the first metal wire and the second metal wire are evenly arranged, thereby effectively reducing the problem of display mura due to light reflection of a metal wire (for example, the first metal wire) in the active area AA, and improving the display quality of the electronic device.

In a possible implementation, the TFT substrate further includes a light emitting device. The light emitting device is disposed on a side that is of the wiring layer and that is away from the base, and the light emitting device is coupled to the first source drain layer. It should be understood that the first active layer, the first gate, the first source, and the first drain may form a transistor of a pixel circuit. For different types of pixel circuits, a plurality of different transistors may be included, and all sources and drains among the plurality of different transistors may be located at the first source drain layer. That the light emitting device is coupled to the first source drain layer means that the light emitting device is coupled to a source or a drain of a specific transistor in the first source drain layer. Therefore, the light emitting device may also be disposed in the TFT substrate, and is coupled to the first source drain layer, to enable the light emitting device to emit light, so that each sub-pixel in the display module can perform display based on a preset gray scale, and the gray scale displayed by each sub-pixel may form an image.

In a possible implementation, the TFT substrate further includes a second source drain layer. The second source drain layer is disposed between the first source drain layer and the wiring layer. The light emitting device is coupled to the first source drain layer by using the second source drain layer. In this way, resolution of the display module can be increased, and display quality can be improved.

In a possible implementation, the TFT substrate further includes a light emitting device. The light emitting device is disposed on a side that is of the wiring layer and that is away from the base. The light emitting device is coupled to the first source drain layer by using the second metal wire. After the second metal wire is disposed on the wiring layer, the light emitting device may be coupled to the first source drain layer by using the second metal wire, to reduce load of a power wire and reduce a voltage drop (IR drop).

In a possible implementation, the TFT substrate further includes a second source drain layer. The second source drain layer is disposed between the first source drain layer and the wiring layer. The first source drain layer is coupled to the second source drain layer, and the second source drain layer is coupled to the second metal wire. Similarly, after resolution is increased by using the second source drain layer, the second source drain layer may be coupled to the second metal wire, to enable the light emitting device to be coupled to the first source drain layer, and to reduce load of a power wire and reduce a voltage drop (IR drop).

According to a second aspect, this application provides a display module. The display module includes a display driver chip and a TFT substrate according to any one of the foregoing possible implementations of the first aspect. The display driver chip is coupled to a wiring layer in the TFT substrate.

According to a third aspect, this application provides an electronic device. The electronic device includes a printed circuit board, a driver chip, and a TFT substrate according to any one of the foregoing possible implementations of the first aspect. The printed circuit board includes an application processor. The application processor is coupled to the driver chip. The driver chip includes a display driver chip. The display driver chip is coupled to a wiring layer in the TFT substrate.

It may be understood that both the display module provided in the second aspect and the electronic device described in the third aspect are associated with the TFT substrate provided in the first aspect; and for beneficial effects that can be achieved, reference may be made to beneficial effects in the forgoing descriptions on the TFT substrate provided in the first aspect. Details are not described herein again.

DESCRIPTION OF EMBODIMENTS

The following describes technical solutions in embodiments of this application with reference to accompanying drawings in embodiments of this application. Apparently, the described embodiments are merely some rather than all embodiments of this application.

The terms "first", "second", and the like are used herein for description only, and cannot be understood as indicating or implying relative importance or implicitly indicating the quantity of indicated technical features. Therefore, the features defined with "first", "second", and the like can explicitly or implicitly include one or more of the features. In the description of this application, unless otherwise specified, "a plurality of" means two or more.

In the description of this application, it should be understood that the orientation or positional relationship indicated by the terms "center", "up", "down", "front", "back", "left", "right" "vertical", "horizontal", "top" "bottom", "inside", "outside", "lengthwise", and "crosswise", and the like is based on the orientation or positional relationship shown in the accompanying drawings, and is only for ease of describing this application and simplifying the description, rather than indicating or implying that the apparatus or component referred to must have a specific orientation, be constructed and operated in a specific orientation, and therefore cannot be understood as a limitation to this application.

In this application, unless otherwise specified and defined, the term "connection" should be understood in a broad sense. For example, a "connection" may be a fixed connection, may be a detachable connection, or may be integration, and may be a direct connection or an indirect connection implemented by using an intermediate medium. In addition, the term "coupling" may be a manner of implementing electrical connection of signal transmission. A person of ordinary skill in the art can understand specific meanings of these terms in this application based on specific situations.

An embodiment of this application provides an electronic device. The electronic device includes a mobile phone (mobile phone), a pad (pad), a computer, a smart wearable product (for example, a smart watch and a smart band), a set-top box, a media player, a portable electronic device, a virtual reality (virtual reality, VR) terminal device, an augmented reality (augmented reality AR) terminal device, and an electronic product with a display interface. A specific form of the electronic device is not specially limited in this embodiment of this application.

Figure 1:
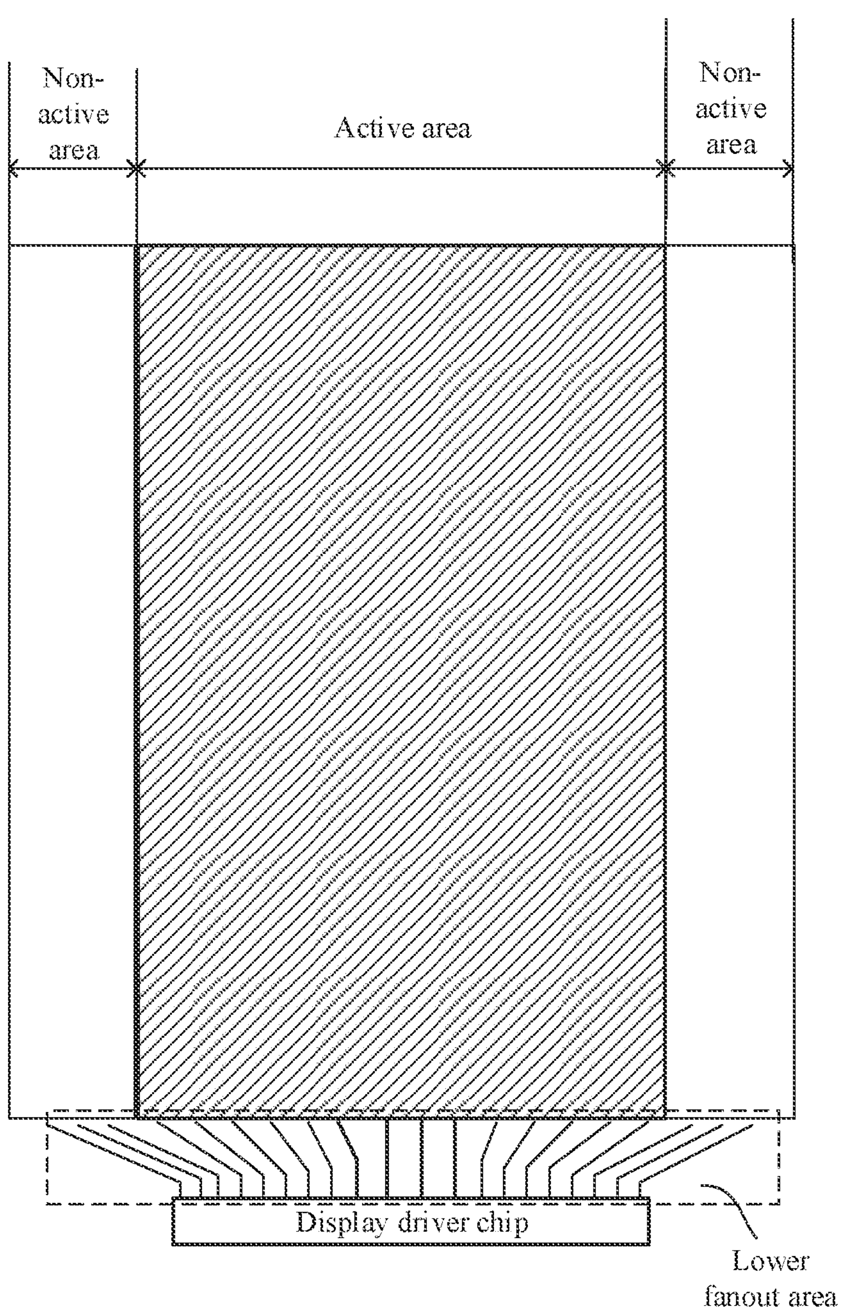
FIG. 1 is a schematic diagram of a structure of a display module with a lower fanout area.
Figures 2, 3:
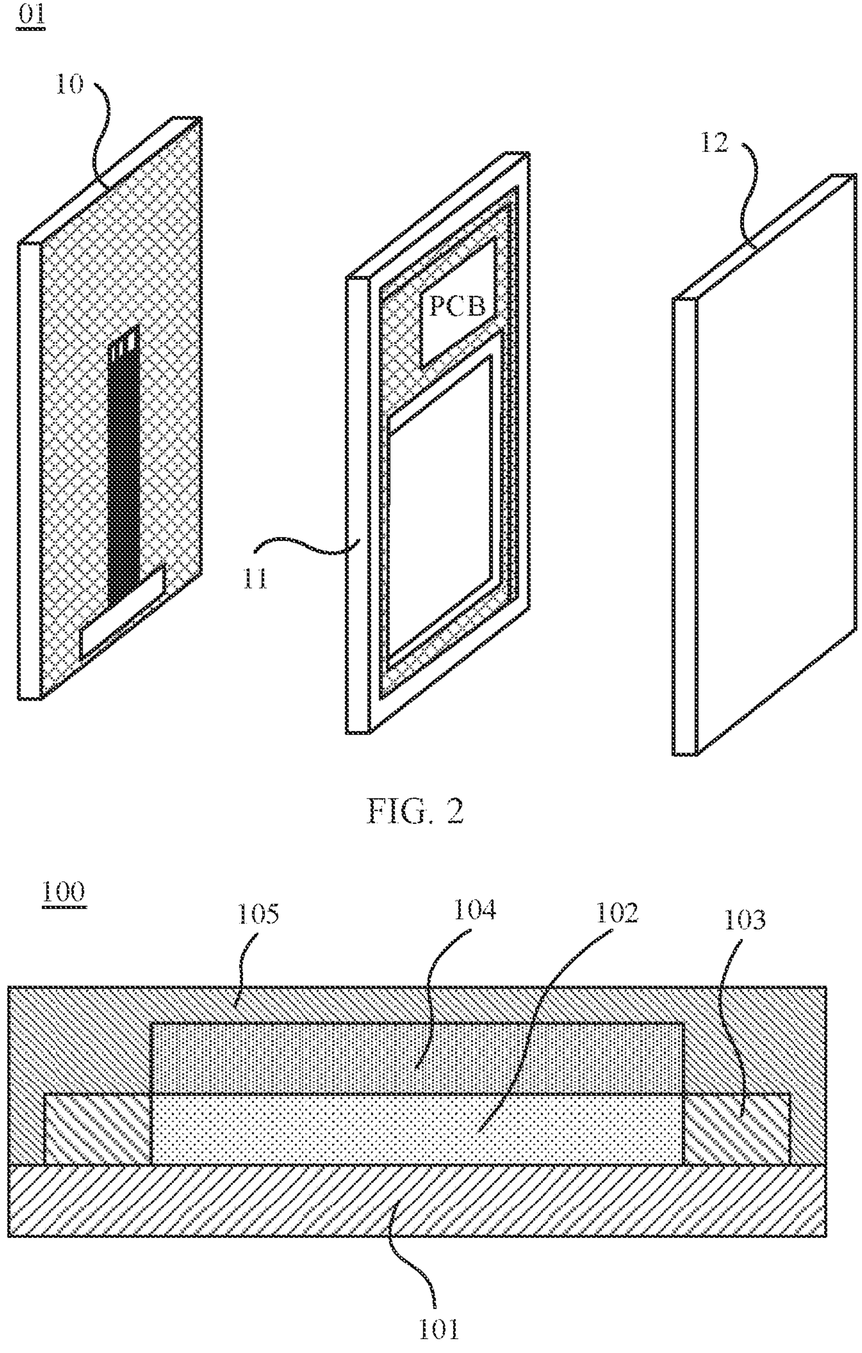
FIG. 2 is a schematic diagram of a structure of an electronic device according to an embodiment of this application.
FIG. 3 is a schematic diagram 1 of a structure of a display module according to an embodiment of this application.

For ease of description, the following uses an example in which an electronic device 01 is a mobile phone shown in FIG. 2. The electronic device 01 includes a display module 10, a middle frame 11, and a rear housing 12. The middle frame 11 is disposed between the display module 10 and the rear housing 12. The display module 10 and the rear housing 12 are separately connected to the middle frame 11. An accommodating cavity formed between the rear housing 12 and the middle frame 11 is configured to accommodate electronic components such as a battery, a camera module (not shown in FIG. 2), and a printed circuit board (printed circuit board, PCB) shown in FIG. 2.

It should be understood that a structure in the electronic device 01 is not limited to a structure such as the display module 10, the middle frame 11, and the rear housing 12, and may further include another structure such as a small board, a battery cover, and a subscriber identity module (subscriber identity module, SIM) card. This is not specially limited in this embodiment of this application.

For any type of the electronic devices 01, the display module 10 is mainly configured to display an image, a video, and the like. As shown in FIG. 3, the display module 10 includes a support backplane 101, a pixel circuit 102, a peripheral drive circuit 103, a light emitting device 104, and a top packaging layer 105. The support backplane 101 is configured to support the pixel circuit 102, the peripheral drive circuit 103, and the light emitting device 104. The top packaging layer 105 is configured to encapsulate the pixel circuit 102, the peripheral drive circuit 103, and the light emitting device 104. Both the pixel circuit 102 and the peripheral drive circuit 103 are fabricated on a same plane of a side of the support backplane, and the peripheral drive circuit is around the pixel circuit 102. The light emitting device 104 is disposed on a side that is of the pixel circuit 102 and that is away from the support backplane 101. The pixel circuit 102 is configured to drive the light emitting device 102 to emit light, so that the display module 10 can display an image. The peripheral drive circuit 103 is used by a processor in the electronic device 01 to control the pixel circuit 102 to operate.

Figure 4:
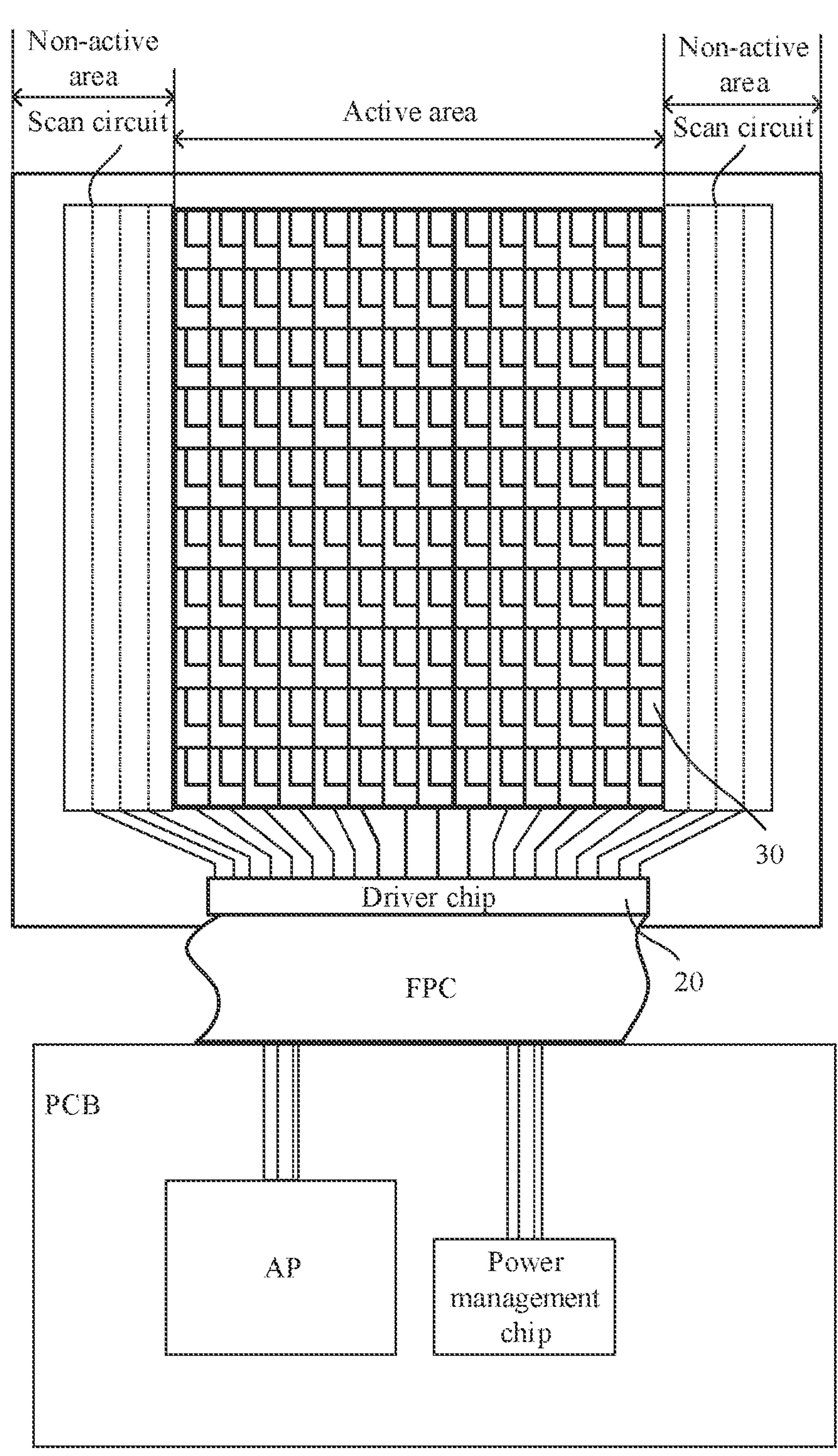
FIG. 4 is a schematic diagram of a structure of another electronic device according to an embodiment of this application.

In this case, as shown in FIG. 4, the display module 10 may include an active area (active area, AA) (also referred to as a pixel area) and a non-active area around the active area AA The active area AA includes a plurality of sub-pixels (sub pixel) 30 arranged in rows and columns. The pixel circuit 102 and the light emitting device 104 shown in FIG. 2 are disposed in each sub-pixel 30. The pixel circuit 102 is configured to drive the light emitting device 104 to emit light, so that each sub-pixel 30 in the display module 10 can perform display based on a preset gray scale. The non-active area includes a scan circuit and a driver chip 20. The scan circuit provides a scan signal required for image display to the active area AA. The driver chip may include a display driver chip (display driver integrated circuit, DDIC) and a scan circuit driver chip. In this case, an OLED display is used as an example. Pixel circuits in a same column of pixels are coupled to the display driver chip by using a same data line (data line, DL), to provide an image signal to the active area AA The scan circuit driver chip is coupled to the scan circuit by using a scan line (scan line, SL), and is configured to control the scan circuit to output the scan signal to the active area AA. The scan circuit and the driver chip 20 may constitute the peripheral drive circuit 103 shown in FIG. 3.

In some embodiments of this application, the light emitting device 104 is a liquid crystal display (liquid crystal display, LCD), an organic light-emitting diode (organic light-emitting diode, OLED), a flex light-emitting diode (flex light-emitting diode, FLED), a mini-LED, a micro-Led, a micro-OLED, a quantum dot light-emitting diode (quantum dot light-emitting diodes, QLED), or the like. For ease of description, the following uses an example in which the light emitting device 104 is the OLED for description.

In addition, as shown in FIG. 4, the electronic device 01 further includes a printed circuit board (printed circuit board, PCB) (or a drive system board), an application processor (application processor, AP) (for example, a CPU) installed on the PCB, and a power management chip (power IC). The driver chip 20 in FIG. 4 is coupled to the AP by using a flexible printed circuit (flexible printed circuit, FPC) board.

In this way, the AP provides display data to the display driver chip and the display module, to display actual image information. The power management chip provides an operating voltage to the display driver chip and the display module. The FPC provides a connection path for signal transmission between the PCB and the display module. The FPC is connected to the PCB by using a connector, and the other end of the FPC is bounded (bonding) to the display module by using an anisotropic conductive film. The driver chip is responsible for receiving a signal transmitted by the PCB and transmitting the signal to the display module based on specific timing control. For example, after the display data output by the AP passes through the driver chip 20, the display data is converted into a data voltage Vdata and transmitted to a pixel circuit coupled to each data line DL. Next, each pixel circuit generates a drive current I matching the data voltage Vdata by using the data voltage Vdata on the data line DL, to drive an OLED device in a pixel to emit light.

The pixel circuit, the OLED device, the data line DL, and the like in each pixel in the display module 10 may be fabricated on a base substrate (namely, the support backplane 101). The base substrate may be formed by using a flexible resin material. In this case, the OLED display may be used as a foldable display. Alternatively, the base substrate in the OLED display may be formed by using a material with a relatively hard texture, such as glass. In this case, the OLED display is a hard display.

Figure 5:
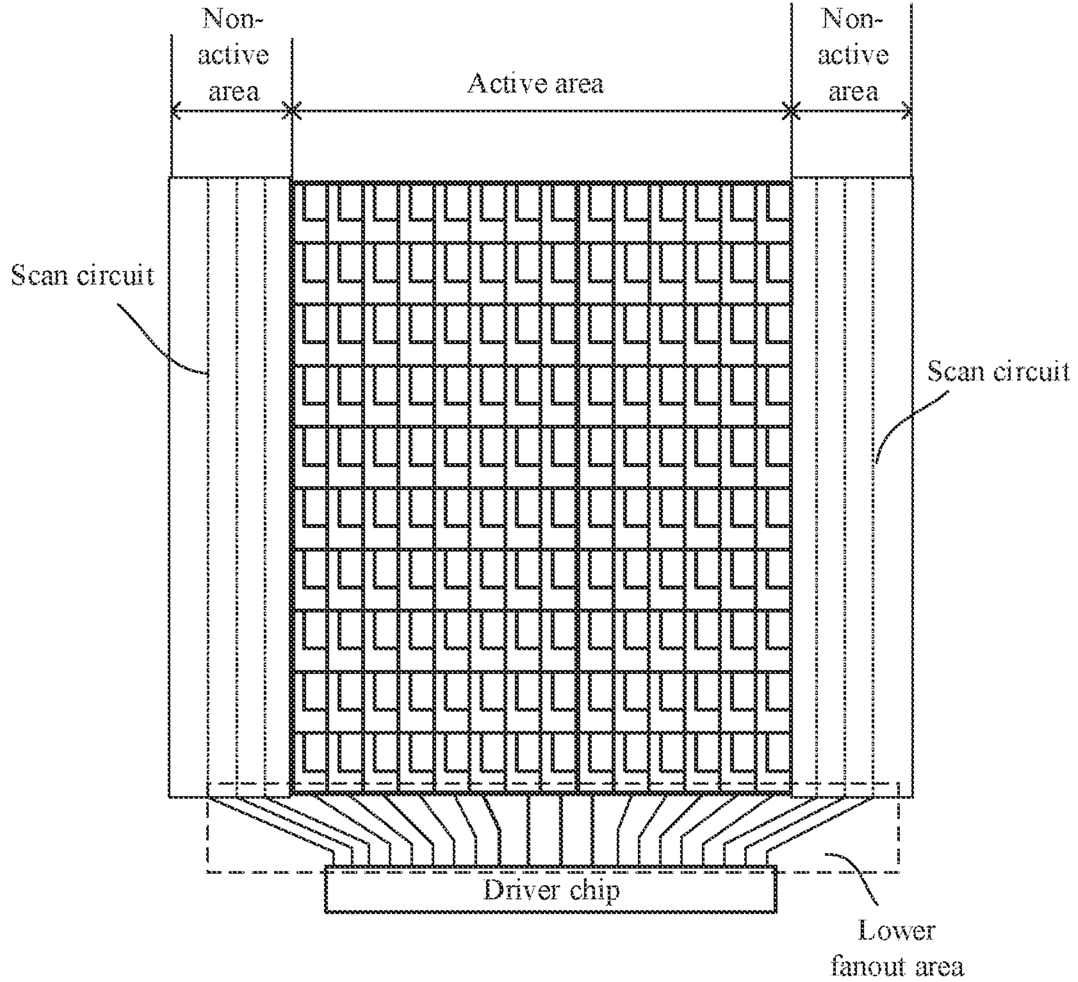
FIG. 5 is a schematic diagram 2 of a structure of a display module according to an embodiment of this application.

It should be noted that, as a requirement on a screen-to-body ratio of an electronic device becomes increasingly high, the display module 10 of the electronic device needs to reduce the non-active area. For example, a size of the non-active area may be compressed by compressing the scan circuit, or by using a waterfall screen or a curved screen to change the non-active area from a horizontal direction to a vertical direction, in other words, the non-active area is bent downward. However, as shown in FIG. 5, a lower fanout (fanout) area further exists between the active area AA and the driver chip 20 in the display module 10. The lower fanout area couples, in a fanout manner, the display driver chip 20 to the data line DL in the active area AA, to provide the image signal to the active area AA. A size of the lower fanout area cannot be reduced through compression or bending. Therefore, generally, a size of a non-active area at a lower frame of the electronic device is relatively large, which greatly affects an increase in the screen-to-body ratio of the electronic device.

Based on this, some embodiments of this application provide a TFT substrate. The TFT substrate may adjust a lower fanout area to an active area AA, which may be referred to as fanout in AA (fanout in AA, FIAA). In this way, the lower fanout area no longer occupies a non-active area, so that a size of the non-active area can be reduced, and a screen-to-body ratio of an electronic device can be increased.

The following describes in detail the TFT substrate provided in some embodiments of this application with reference to the accompanying drawings. It should be understood that the TFT substrate includes a support backplane 101, a pixel circuit 102, and a light emitting device 104 shown in FIG. 3, that is, an active area A in a display module 10 shown in FIG. 4.

Figure 6:
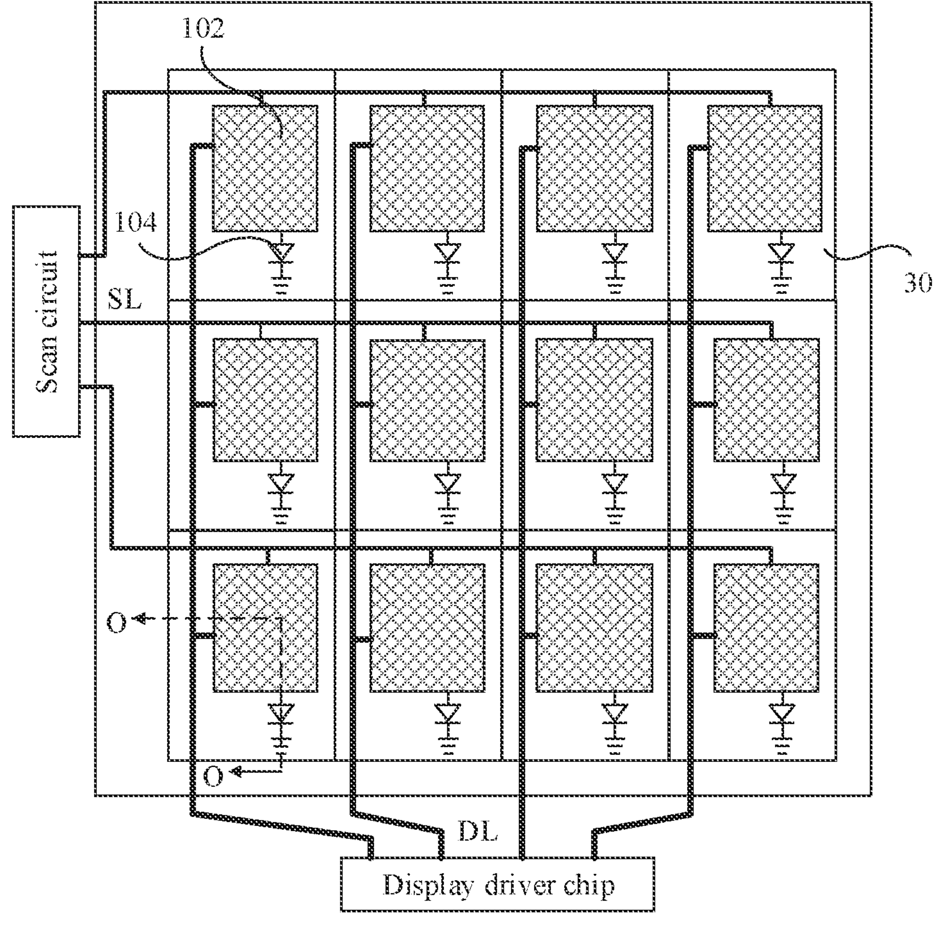
FIG. 6 is a schematic diagram 3 of a structure of a display module according to an embodiment of this application.

As shown in FIG. 6, each sub-pixel 30 in the active area AA in the display module includes a pixel circuit 102 and a light emitting device 104. The pixel circuit 102 is coupled to a scan circuit by using a scan line SL, and is configured to receive a scan signal of the scan circuit. The pixel circuit 102 is further coupled to a display driver chip by using a data line DL, and is configured to receive an image signal of the display driver chip, so as to drive the light emitting device 104 to emit light, so that each sub-pixel 30 in the active area AA can perform display based on a preset gray scale. A gray scale displayed by each sub-pixel 30 may form an image.

In some embodiments of this application, the pixel circuit 102 may include a plurality of transistors and at least one capacitor, and the transistor may be a thin film transistor (thin film transistor, TFT).

Figure 7:
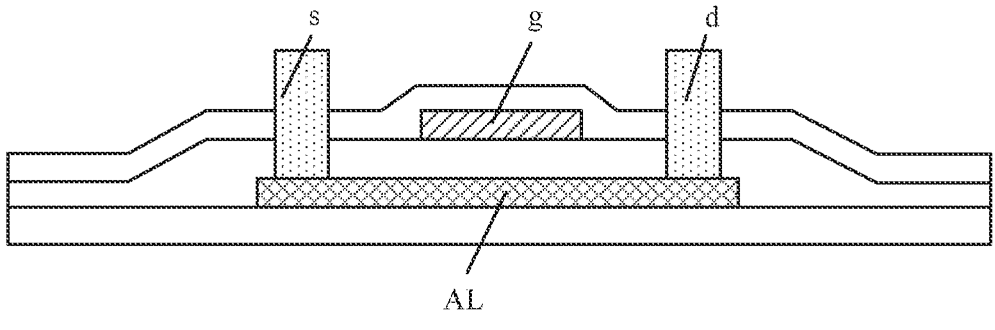
FIG. 7 is a schematic diagram of a structure of a transistor according to an embodiment of this application.

Any one of the transistors may include a gate (gate, g), an active layer (active layer, AL), a first electrode (for example, a source (source, s)), and a second electrode (for example, a drain (drain, d)) that are shown in FIG. 7 (a sectional view of the transistor). Alternatively, the first electrode of the transistor may be the drain d, and the second electrode of the transistor may be the source s. This application sets no limitation thereto. For ease of description, the following uses an example in which the first electrode of the transistor is the source s and the second electrode of the transistor is the drain d for description.

The active layer AL is formed by using a semiconductor material. When the transistor can conduct a voltage applied to the gate g of the transistor, the active layer AL is converted from an insulator to a conductor, so that the source s and the drain g of the transistor are coupled. When the transistor cannot conduct a voltage applied to the gate g of the transistor, the active layer AL is in an insulation state, and the source s is disconnected from the drain d of the transistor.

Performance of the transistor varies depending on the material forming the active laver of the above transistor. For example, when a material forming the active layer of the transistor is polycrystalline silicon (for example, low temperature polycrystalline silicon, low temperature poly-silicon, LTPS), because a polycrystalline silicon transistor has high electron mobility, the polycrystalline silicon transistor is generally applied to a situation in which a switching frequency is relatively high (for example, an electronic device 01 is in a powered-on state), to improve switch efficiency. It should be noted that the low temperature polycrystalline silicon is polycrystalline silicon deposited at a low temperature (for example, a temperature lower than 600° C.) environment.

Alternatively, for another example, when the material forming the active layer of the transistor is a semiconductor oxide (for example, an amorphous indium gallium zinc oxide, indium gallium zinc oxide, IGZO), because a semiconductor oxide transistor has electron mobility lower than that of the polycrystalline silicon transistor but has an excessively low off-state current, the semiconductor oxide transistor is generally applied to a situation in which a switching frequency is relatively low (for example, the electronic device 01 is in a standby state), to reduce a leakage current, so that power consumption can be reduced. In the following, for ease of description, a transistor whose active layer is the polycrystalline silicon is referred to as a first transistor, and a transistor whose active layer is the semiconductor oxide is referred to as a second transistor.

For example, in some embodiments, the pixel circuit 102 includes at least one first transistor and at least one second transistor, to allow the pixel circuit 102 to be quickly enabled when driven at a high frequency (for example, the electronic device 01 is in the powered-on state) and reduce the power consumption when driven at a low frequency (for example, the electronic device 01 is in the standby state).

Figure 8:
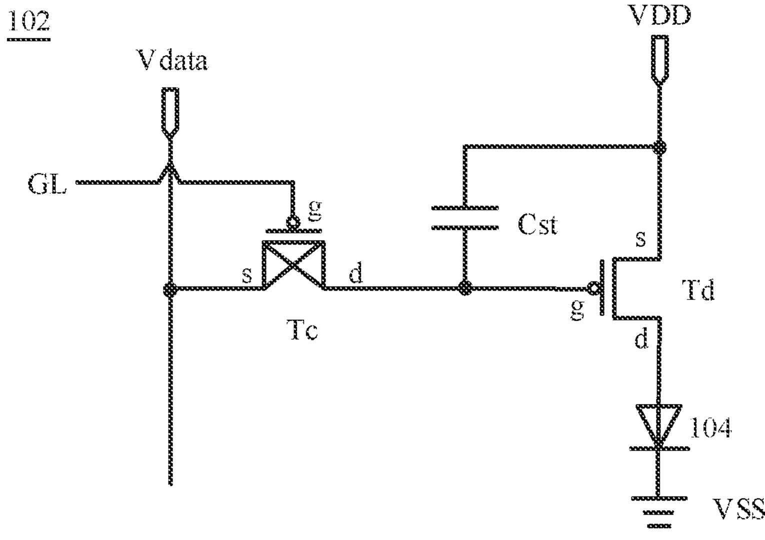
FIG. 8 is a schematic diagram of a circuit structure of a pixel circuit according to an embodiment of this application.

As shown in FIG. 8, the pixel circuit 102 may include a drive transistor Td, a switch transistor Tc, and a capacitor Cst. In this case, the pixel circuit 102 is of a 2T1C structure. "2T" refers to two transistors, and "1C" refers to one storage capacitor.

For example, a gate g of the switch transistor Tc is coupled to a gate line (gate line, GL), and the gate line GL is coupled to the scan line SL. A source s of the switch transistor Tc is coupled to the data line (data line, DL), to transmit a data voltage Vdata to the source s of the switch transistor Tc through the data line D. A drain d of the switch transistor Tc is coupled to one end of the storage capacitor Cst, and the other end of the storage capacitor Cst is coupled to a power supply VDD. The drain d of the switch transistor Tc is further coupled to a gate g of the drive transistor Td, a source s of the drive transistor Td is coupled to the power supply VDD, a drain d of the drive transistor Td is coupled to an anode (anode) of the light emitting device 104, and a cathode (cathode) of the light emitting device 104 is grounded.

The switch transistor Tc is configured to be turned on under control of the gate line (gate line, GL), to write the data voltage Vdata to the gate g of the drive transistor Td and the storage capacitor Cst. The storage capacitor Cst can maintain a gate voltage of the drive transistor Td, so that the gate voltage of the drive transistor Td is stable in a picture frame. In this case, the drive transistor Td may generate a drive current based on the data voltage Vdata, so that the light emitting device 104 may emit light based on the drive current.

In some embodiments of this application, the drive transistor Td in FIG. 8 may be the first transistor, for example, an active layer of the drive transistor Td is LTPS. In addition, the switch transistor Tc may be the second transistor, for example, an active layer of the switch transistor is IGZO. In this case, because the drive transistor Td (namely, the first transistor) has high electron mobility when the first transistor is connected to the light emitting device 104, the light emitting device 104 can be quickly enabled. Because the second transistor has an excessively low off-state current, when the second transistor is used as the switch transistor Tc to control circuit switching, a leakage current may be reduced, so that power consumption is reduced and a standby time of the device is increased.

Alternatively, in other embodiments of this application, the drive transistor Td in FIG. 8 may be the second transistor, for example, the active layer of the drive transistor Td is IGZO. In addition, the switch transistor Tc may be the first transistor, for example, the active layer of the switch transistor Tc is LTPS.

It should be understood that the foregoing pixel circuit 102 is merely an example for description. In some embodiments, a quantity of the switch transistor may be increased, to eliminate impact of a threshold voltage (Vth) of the drive transistor Td on luminosity of the light emitting device 104 and improve uniformity of luminosity of light emitting devices, for example, the pixel circuit 102 may be of a 7T1C or 8T1C structure. Certainly, in some embodiments, the pixel circuit 102 may alternatively include only one transistor, such as the first transistor or the second transistor. Therefore, a structure of the pixel circuit 102 is not specially limited in this embodiment of this application.

For ease of description, the following uses an example in which the structure of the pixel circuit 102 is 2T1C, and in the pixel circuit 102, the drive transistor Td is the first transistor (for example, whose active layer is LIPS), and the switch transistor Tc is the second transistor (for example, whose active layer is IGZO), to describe the TFT substrate provided in this embodiment of this application.

Figure 9:
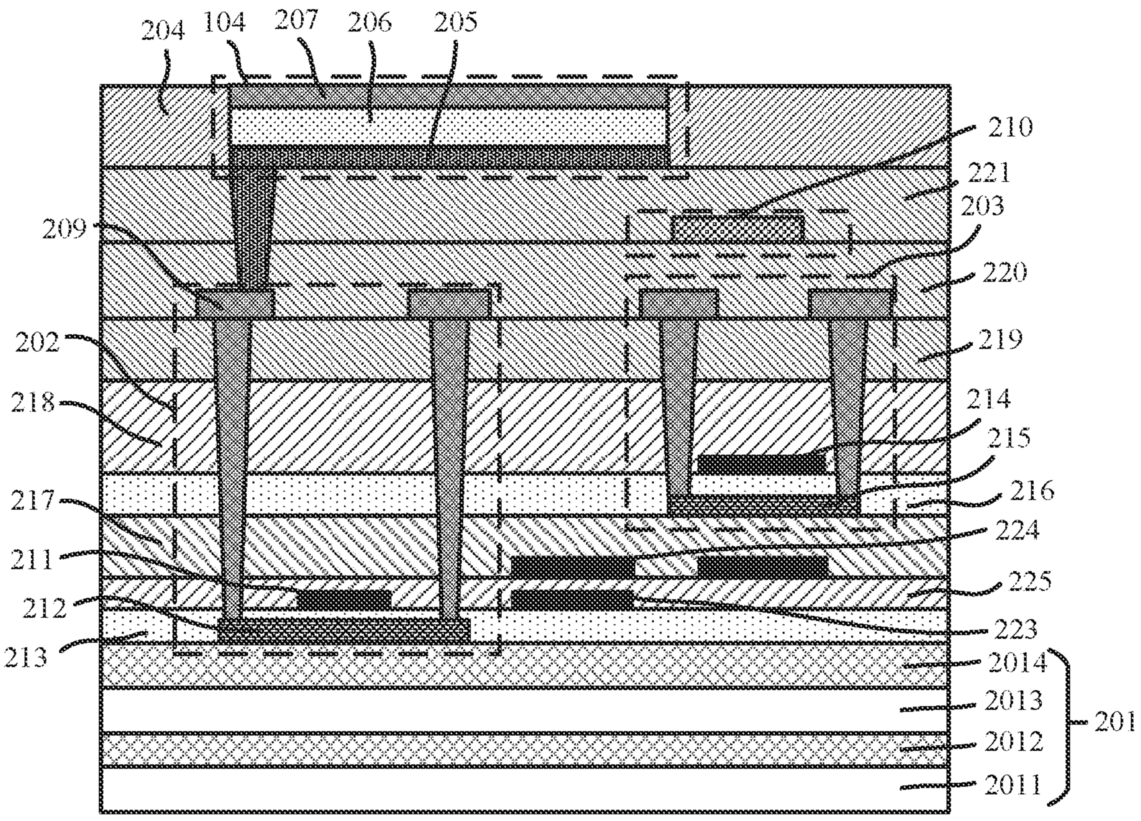
FIG. 9 is a schematic diagram 1 of a structure of a TFT substrate according to an embodiment of this application.
Figure 10:
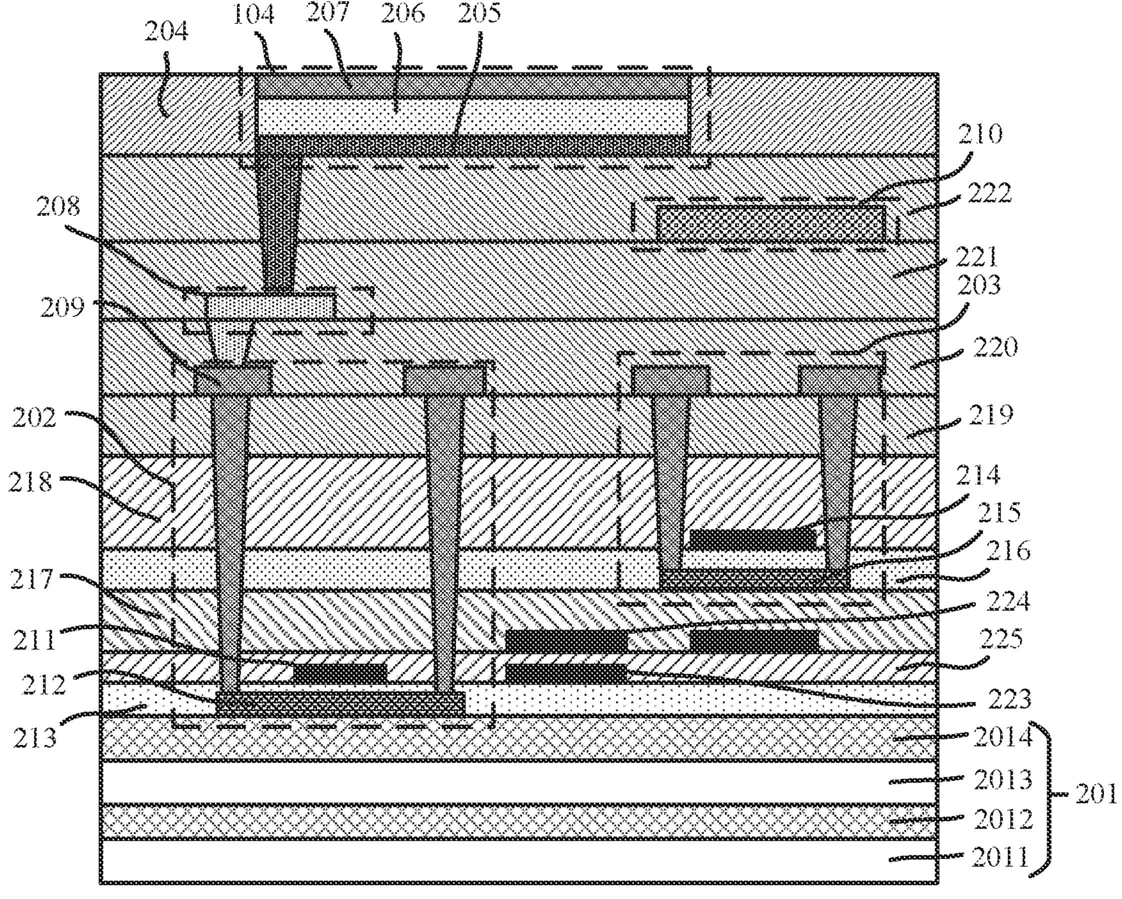
FIG. 10 is a schematic diagram 2 of a structure of a TFT substrate according to an embodiment of this application.

As shown in FIG. 9 or FIG. 10 (a sectional view obtained by cutting along a dashed line O-O in FIG. 6), the TFT substrate provided in this embodiment of this application includes a base 201, a first transistor (for example, whose active layer is LTPS) 202 and a second transistor (for example, whose active layer is IGZO) 203 disposed on a side of the base 201, and a pixel definition layer (pixel definition layer, PDL) 204 disposed on a side that is of the first transistor 202 and the second transistor 203 and that is away from the base 201. The pixel definition layer 204 has a plurality of hollow-out structures. One light emitting device 104 may be disposed in one of the hollow-out structures of the pixel definition layer 204. The light emitting device 104 may include an anode (anode) 205, a light emitting layer 206, and a cathode 207 that are sequentially laminated from bottom to top.

In this embodiment of this application, a material forming the base 201 may include a hard material, for example, at least one of glass, sapphire, or a metal material. Alternatively, the material forming the foregoing base 201 may include a flexible material, such as a macromolecular polymer material. For example, when the material of the base 201 includes the flexible material, as shown in FIG. 9 or FIG. 10, the base 201 may include a first base layer 2011 (for example, polyimide (polyimide, PI)), a first barrier layer 2012 (for example, silicon oxide, SiOx), a second layer 2013 (for example, PI), and a second barrier layer 2014 (for example, silicon oxide, SiOx). The first base layer 2011, the first barrier layer 2012, the second layer 2013, and the second barrier layer 2014 are sequentially laminated.

It may be learned from the foregoing description that the first transistor 202 may include a gate 211, a first electrode (for example, a source s), a second electrode (for example, a drain d) 209, and an active layer 212. As shown in FIG. 9 or FIG. 10, a first gate insulation layer 213 (for example, a silicon oxide SiOx layer) exists between the gate 211 and the active layer 212 of the first transistor 202, and the gate 211 of the first transistor 202 is further away from the base 201 than the active layer 212. Therefore, the first transistor 202 is a top-gate transistor.

Similarly, the second transistor 203 may include a gate 214 (namely, a first gate), a first electrode (for example, a source s) (namely, a first source), a second electrode (for example, a drain d) (namely, a first drain), and an active layer 215 (namely, a first active layer). A second gate insulation layer 216 (for example, a silicon oxide SiOx layer) exists between the gate 214 and the active layer 215 of the second transistor 203, and the gate 214 of the second transistor 203 is further away from the base 201 than the active layer 215. Therefore, the second transistor 202 of the second transistor is also a top-gate transistor.

A material that forms the gate 211 of the first transistor 202 and the gate 214 of the second transistor 203 may be a metal material such as molybdenum (Mo), a titanium-aluminum-titanium (Ti/Al/Ti) alloy, (a molybdenum-aluminum-molybdenum Mo/Al/Mo alloy), and titanium (Ti).

Because the active layer 212 of the first transistor 202 is made of polycrystalline silicon, and the active layer 215 of the second transistor 203 is made of a semiconductor oxide, to prevent ion diffusion at the active layer 212 of the first transistor 202 and the active layer 215 of the second transistor 203 from affecting a function of the transistor, a barrier layer 217 usually exists between the first gate insulation layer 213 and the second gate insulation layer 216.

In addition, the TFT substrate further includes a storage capacitor Cst. The storage capacitor Cst may further include a first electrode 223 and a second electrode 224. The first electrode 223 is disposed on a surface of a side that is of the first gate insulation layer 213 and that is away from the base 201, and the first electrode 223 and the gate 211 of the first transistor 202 are at a same layer and are made of a same material. A third gate insulation layer 225 is further disposed between the first gate insulation layer 213 and the barrier layer 217. The second electrode 224 is disposed on a surface of a side that is of the third gate insulation layer 225 and that is away from the base 201, the second electrode 224 is coupled to the first transistor 2021 and the second electrode 224 and the gate 211 of the second transistor 203 are made of a same material. In this case, the second electrode 224 is a top plate of the storage capacitor Cst, and the first electrode 222 is a bottom plate of the storage capacitor.

An interlayer dielectric layer 218 is disposed on a side that is of the second gate insulation layer 216 and the gate 214 of the second transistor 203 and that is away from the base 201 for isolation. An organic film as a first planarization (Planarization, PLN) layer 219 may be covered on a side that is of the interlayer dielectric layer 218 and that is away from the base 201.

Generally, the source s and the drain d of the first transistor 202 and the source s and the drain d of the second transistor 203 are disposed in a same layer structure. For ease of description, a layer structure in which the source s and the drain d of the first transistor 202 and the source s and the drain d of the second transistor 203 are disposed is referred to as a first source drain layer. The first source drain layer may be fabricated on a side that is of the first planarization layer 219 and that is away from the base 201. The source s and the drain d of the first source drain layer may be coupled to an active layer of a corresponding transistor (for example, the first transistor or the second transistor) by using a via hole.

According to FIG. 8, the first transistor 202 may be used as the drive transistor Td shown in FIG. 8. Therefore, in some embodiments of this application, as shown in FIG. 9, a second electrode 209 of the first transistor 202 may be directly coupled to the anode 205 of the light emitting device 104. Alternatively, as shown in FIG. 10, the TFT substrate may further include a second source drain layer 208. The second source drain layer 208 is disposed on a side that is of the first source drain layer and that is away from the base 201. The second electrode 209 of the first transistor 202 may be coupled to the anode 205 of the light emitting device 104 by using the second source drain layer 208. In comparison with that the second electrode 209 of the first transistor 202 is directly coupled to the anode 205 of the light emitting device 104, the second electrode 209 of the first transistor 202 is coupled to the anode 205 of the light emitting device 104 by using the second source drain layer 208, so that resolution of the display module formed by using the TFT substrate is increased.

According to FIG. 8, the second transistor 203 may be used as the switch transistor Tc shown in FIG. 8, and the source s of the switch transistor Tc needs to be coupled to the data line DL. Generally, the data line DL may be disposed at the first source drain layer (not shown in the figure) in the TFT substrate. To ensure signal transmission, in the conventional technology, the lower fanout area is used to enable the data line DL to be coupled to the driver chip, so that the image signal (namely, the data voltage Vdata) provided by the driver chip can be transmitted to the switch transistor Tc, and then transmitted to the drive transistor Td, so as to drive the light emitting device 104 to emit light.

However, in some embodiments of this application, as shown in FIG. 9 or FIG. 10, the TFT substrate further includes a wiring layer 210. As shown in FIG. 9, when the second electrode 209 of the first transistor 202 is directly coupled to the anode 205 of the light emitting device 104, the wiring layer 210 is disposed between the first source drain layer and the pixel definition layer 204. For example, an organic film may be covered on a side that is of the first source drain layer and that is away from the base 201 as a second planarization layer 220. The wiring layer 210 may be fabricated on a side that is of the second planarization layer 220 and that is away from the base 201. An organic film may be covered on a side that is of the wiring layer 210 and that is away from the base 201 as a third planarization layer 221. The pixel definition layer may be located on a side that is of the third planarization layer 221 and that is away from the base 201.

As shown in FIG. 10, when the second electrode 209 of the first transistor 202 is coupled to the anode 205 of the light emitting device 104 by using the second source drain layer 208, the wiring layer 210 is disposed between the second source drain layer 208 and the pixel definition layer 204. For example, an organic film may be covered on a side that is of the first source drain layer and that is away from the base 201 as a second planarization layer 220. The second source drain layer 208 may be fabricated on a side that is of the second planarization layer 220 and that is away from the base 201, and is configured to be coupled to the first source drain layer (for example, coupled to the second electrode 209 of the first transistor 202) by using a via hole. An organic film may be covered on a side that is of the second source drain layer 208 and that is away from the base 201 as the third planarization layer 221. The wiring layer 210 may be fabricated on a side that is of the third planarization layer 221 and that is away from the base 201. An organic film may be covered on a side that is of the wiring layer 210 and that is away from the base 201 as a fourth planarization layer 222. The pixel definition layer 204 may be disposed on a side that is of the fourth planarization layer 222 and that is away from the base 201, and the anode 205 of the light emitting device 104 inside the hollow-out structure of the pixel definition layer 204 may be coupled to the second source drain layer 208 by using a via hole, so that the second electrode 209 of the first transistor 202 is enabled to be coupled to the anode 205 of the light emitting device 104.

The wiring layer 210 includes a plurality of first metal wires 2101, the plurality of first metal wires 2101 respectively correspond to the plurality of data lines (data line, DL) in the TFT substrate, and the plurality of first metal wires 2101 are configured to connect the plurality of data lines DL in the TFT substrate. For example, the plurality of data lines DL of the TFT substrate are generally disposed at the first source drain layer of the first transistor 202, and may be coupled to the source or the drain of the second transistor 203. Therefore, each first metal wire 2101 of the wiring layer 210 may be coupled to a corresponding data line DL in the TFT substrate by using a via hole (not shown in the figure, and a conductive material such as a metal material is filled in the via hole). The plurality of first metal wires 2101 of the wiring layer 210 may be further coupled to the driver chip by using a wirebond (wirebond), so that fanout in the active area AA may be implemented to enable the driver chip to be coupled to the data line DL in the TFT substrate, thereby reducing the size of the non-active area, and increasing the screen-to-body ratio of the electronic device.

Figure 11:
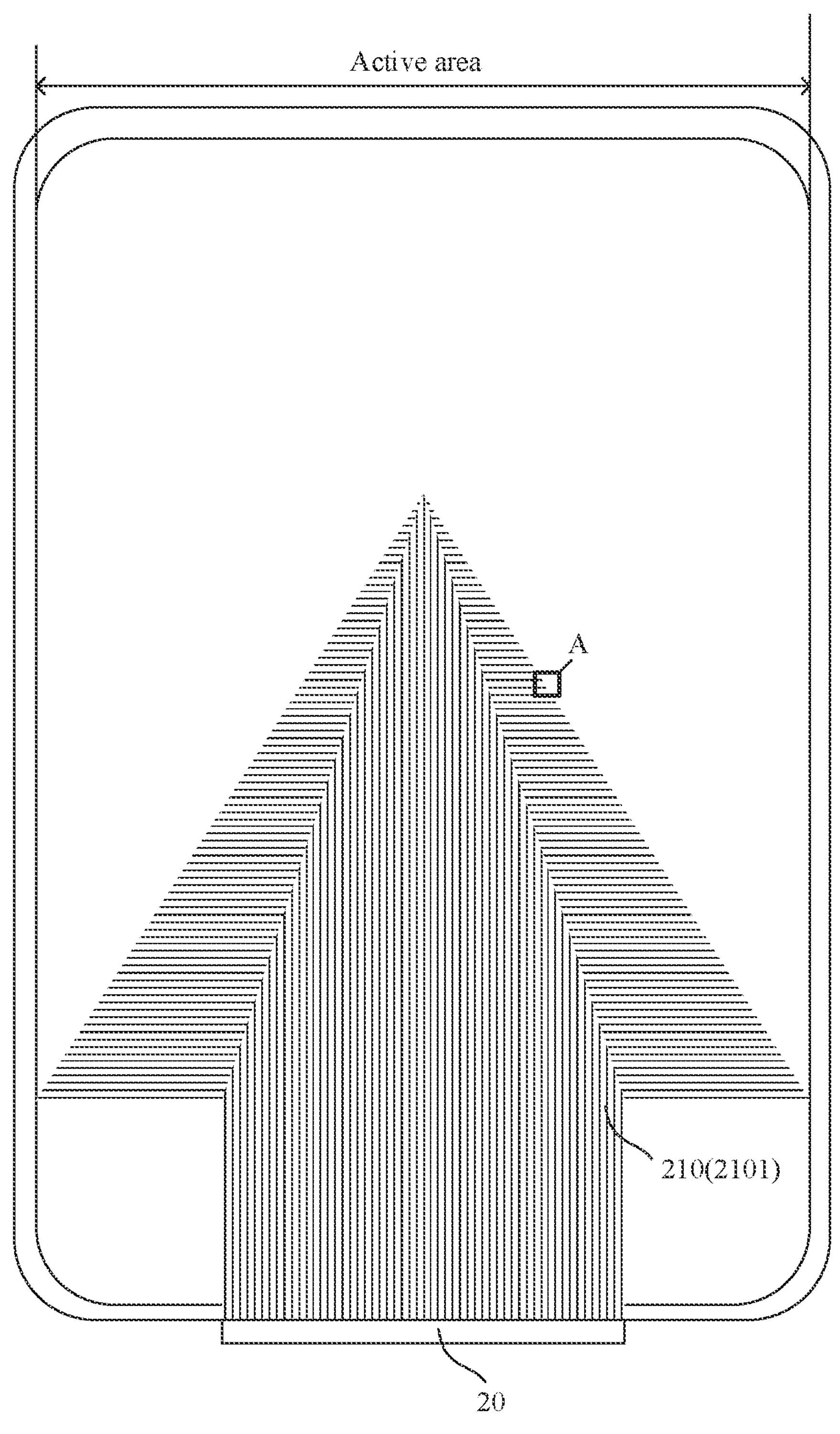
FIG. 11 is a schematic diagram 4 of a structure of a display module according to an embodiment of this application.
Figure 12:
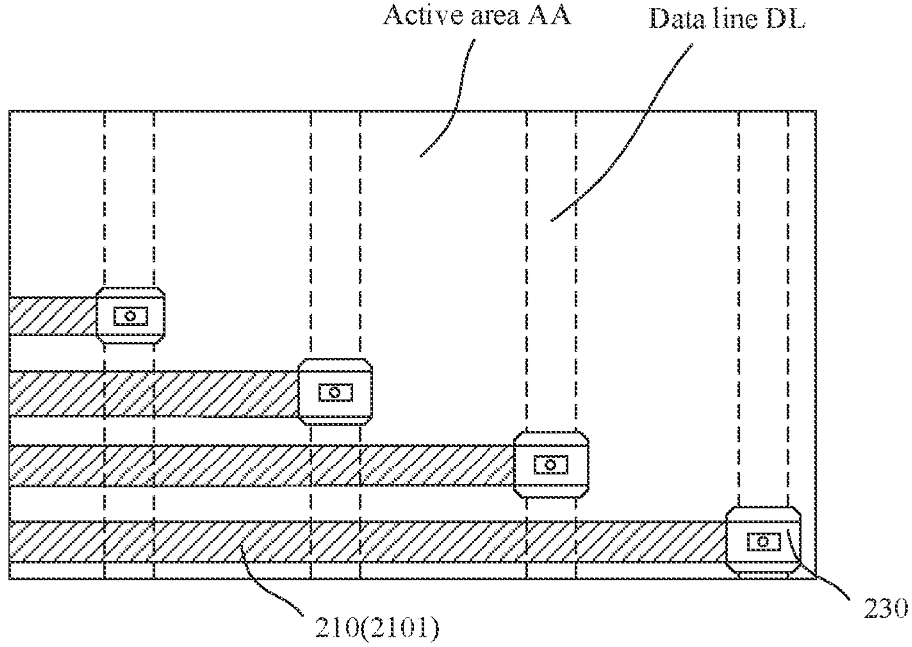
FIG. 12 is a partially enlarged view of place A in FIG. 11.

It should be noted that in the TFT substrate shown in FIG. 9 or FIG. 10, the wiring layer 210 includes only the first metal wire 2101 configured to connect the data line DL of the TFT substrate to the driver chip. Generally, the driver chip is disposed at a lower edge of the AA area. Therefore, the first metal wire 2101 of the wiring layer 210 is distributed in a lower area of the AA area, as shown in FIG. 11. The lower area of the AA area herein also includes two sides of the AA area that is, the lower area of the AA area is all areas extending from the lower edge of the AA area along the two sides of the AA area toward the middle of the AA area). In addition, for ease of a wiring arrangement at the wiring layer 210, different first metal wires 2101 are not crossed and are isolated from each other (in other words, separated from each other), For example, as shown in FIG. 12 (a partially enlarged view of place A in FIG. 11), different data lines DL are connected to via holes 230 of the first metal wires 2101, and the via holes 230 are staggered from each other in an extension direction of the data line DL. After being connected to a via hole 230 of the corresponding data line DL, each first metal wire 2101 extends in an "L" shape in the second source drain layer 210, so that after all the first metal wires 2101 are arranged, all the first metal wires 2101 form a first area similar to a "house" shape. It should be understood that, based on different arrangements of the via holes 230, an area formed by the first metal wires 2101 may be of any other shape, such as an inverted triangle or a trapezoid.

After the wiring layer 210 formed by the first metal wire 2101 is added, a problem of inconsistent load of the pixel circuit exists between a sub-pixel 30 covered with the first metal wire 2101 and a sub-pixel 30 not covered with the first metal wire 2101. This may cause a problem of inconsistent brightness between different sub-pixels 30, and consequently, display quality of the electronic device is reduced. In addition, the first area formed by the first metal wire 2101 will form a reflective area compared to the area without the first metal wire 2101, which results in display mura of different sub-pixels 30 in the active area AA.

Figure 13:
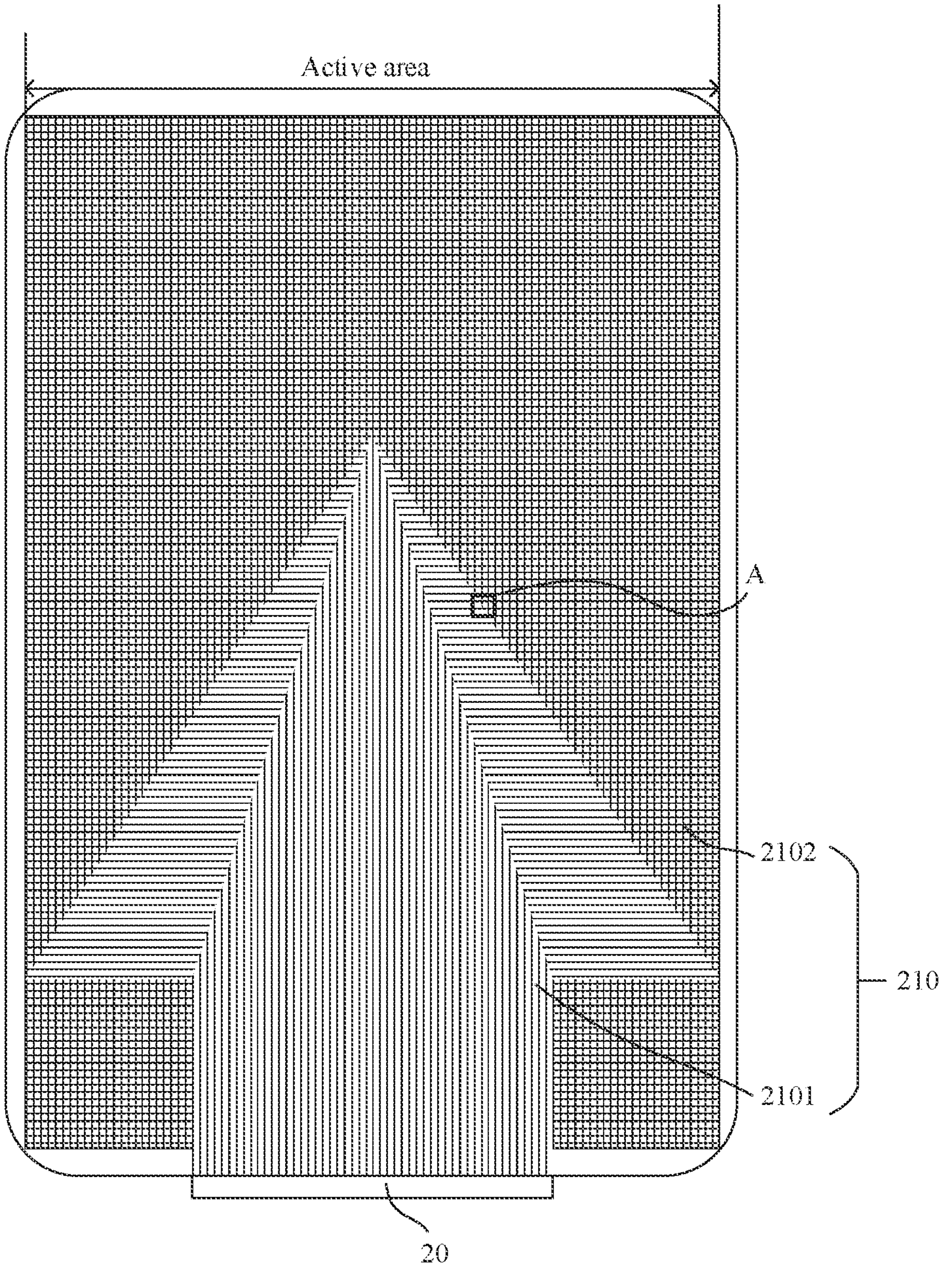
FIG. 13 is a schematic diagram 5 of a structure of a display module according to an embodiment of this application.
Figure 14:
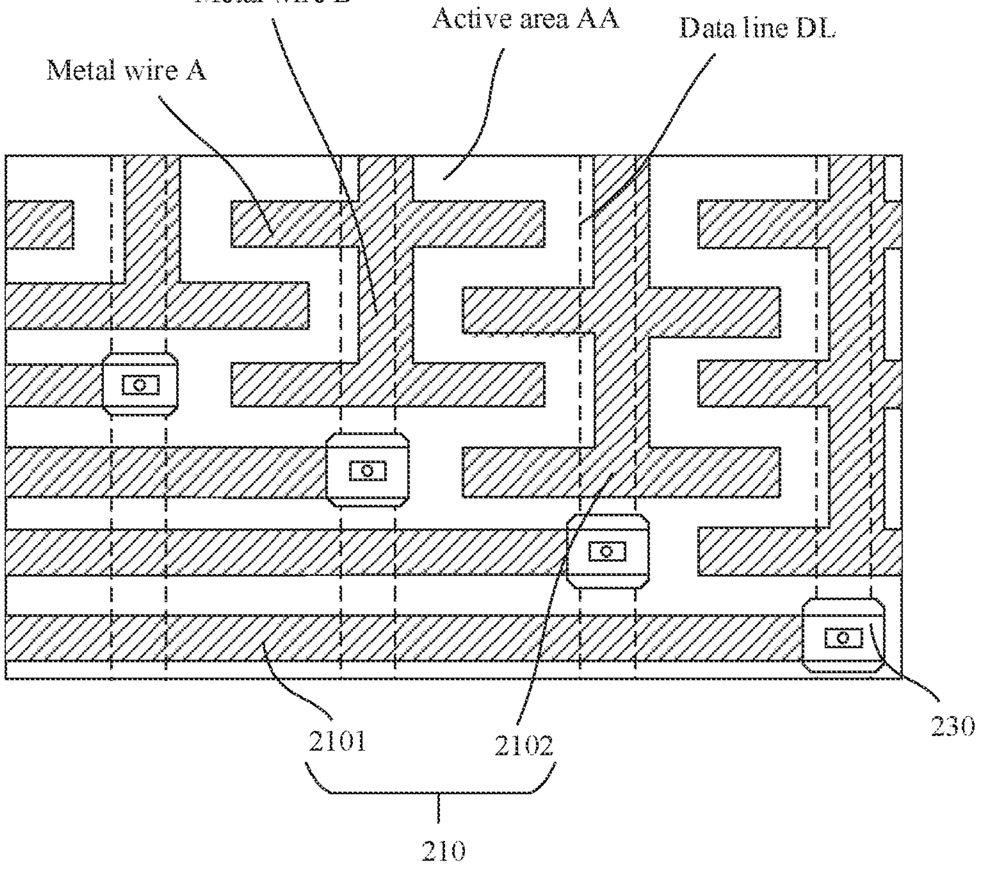
FIG. 14 is a partially enlarged view of place A in FIG. 13.

In some embodiments of this application, to resolve the foregoing problem of inconsistent load of the pixel circuit and the problem of display mura in different areas, as shown in FIG. 13, a second metal wire 2102 may be covered in an area (namely, a second area) (may also be referred to as a Dummy area) that is of the active area AA and that is not covered with the first metal wire 2101. In other words, in the TFT substrate, the wiring layer 210 includes the first metal wire 2101 and the second metal wire 2102. For a connection relationship of the first metal wire 2101, refer to the foregoing description, Details are not described herein again. The second metal wire 2102 is not connected to the first metal wire 2101, and does not have any electrical connection relationship (in other words, the second metal wire 2102 is separated from the first metal wire 2101). An arrangement manner of the second metal wire 2102 may be similar to that of the first metal wire 2101. For example, as shown in FIG. 14 (a partially enlarged view of place A in FIG. 13), each column of the sub-pixels 30 may correspond to a group of the second metal wires 2102, and each group of the second metal wires 2102 is disconnected from each other and does not have any electrical connection relationship (in other words, separated from each other). Each group of the second metal wires 2102 may be formed by coupling a metal wire A (namely, a first sub-wire) and a metal wire B (namely, a second sub-wire) that are staggered. A direction of the metal wire A may be the same as that of one side of the "L" shape of the first metal wire 2101, and a direction of the metal wire B may be the same as that of the other side of the "L" shape of the first metal wire 2101. In this way, from an overall perspective on the active area AA, an arrangement direction of the first metal wire 2101 and that of the second metal wire 2102 are the same (that is, in a long-range order), so that the first metal wire 2101 and the second metal wire 2102 are evenly arranged, thereby effectively reducing the problem of display mura due to light reflection of a metal wire (for example, the first metal wire 2101) in the active area AA, and improving the display quality of the electronic device. In addition, by disposing the second metal wire 2102, in a local micro-nano circuit (namely, the pixel circuit), pixel circuits in different sub-pixels 30 are separated from each other (that is, in short-range disorder), so that a logical function of each pixel circuit in an entire TFT substrate is ensured, a display problem caused by crosstalk is avoided, and reliability and stability of the electronic device are improved.

Figure 15:
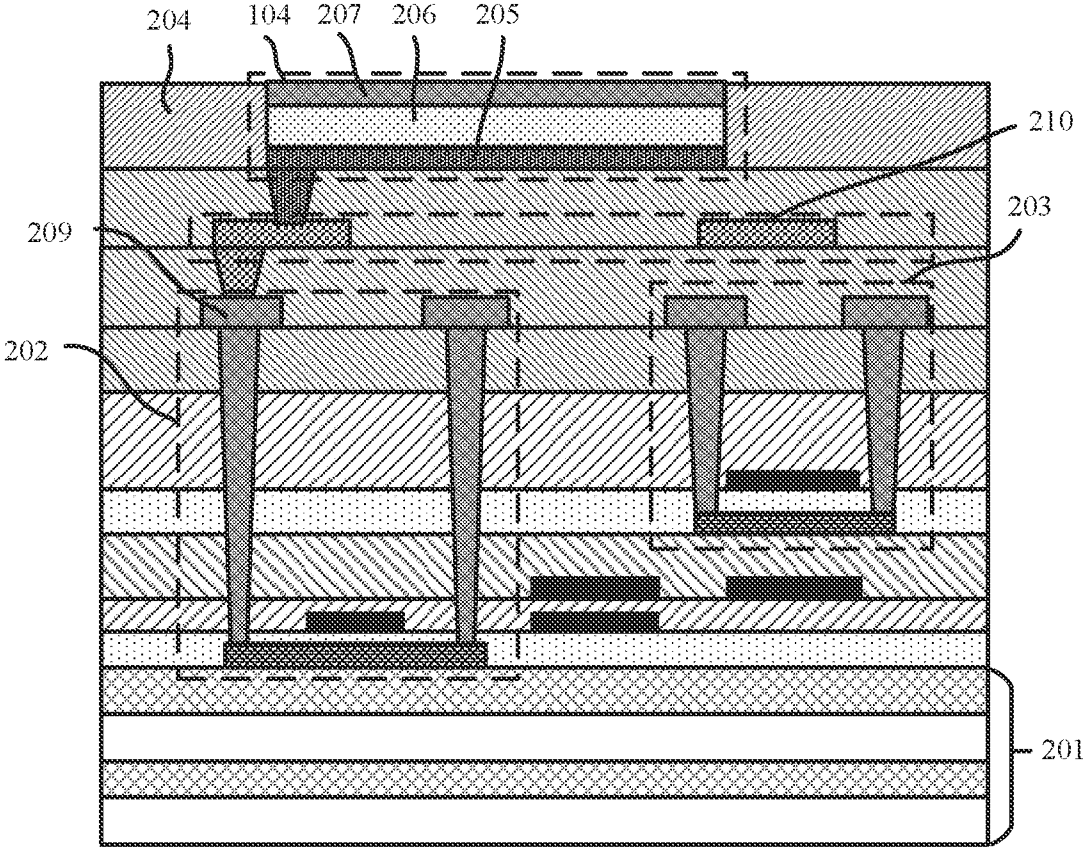
FIG. 15 is a schematic diagram 3 of a structure of a TFT substrate according to an embodiment of this application.
Figure 16:
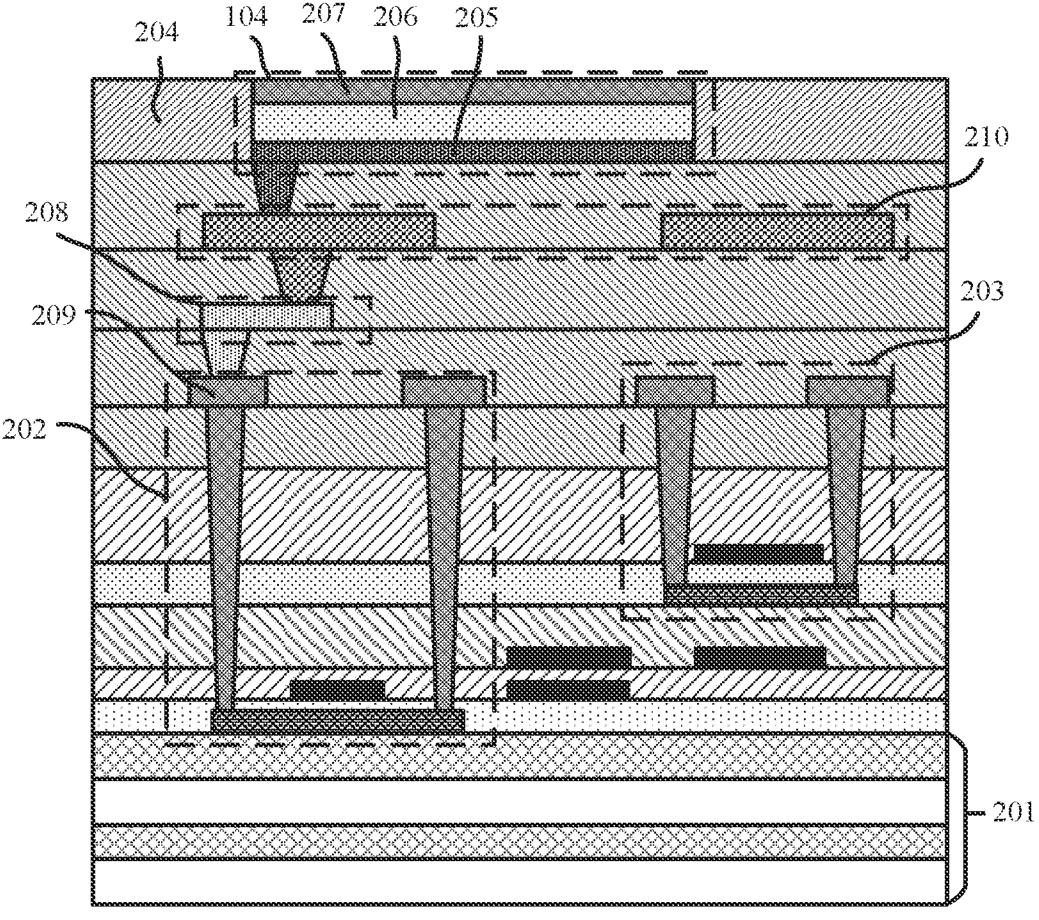
FIG. 16 is a schematic diagram 4 of a structure of a TFT substrate according to an embodiment of this application.

After the second metal wire 2102 is disposed on the wiring layer 210, as shown in FIG. 15, an anode 205 of a light emitting device 104 may be coupled to the second metal wire 2102 of the wiring layer 210 by using a via hole, and the second metal wire 2102 of the wiring layer 210 is coupled to the first source drain layer (that is, coupled to the second electrode 209 of the first transistor 202) by using a via hole, so that the second electrode 209 of the first transistor 202 is coupled to the anode 205 of the light emitting device 104. Alternatively, as shown in FIG. 16, the anode 205 of the light emitting device 104 may be coupled to the second metal wire 2102 of the wiring layer 210 by using a via hole, and the second metal wire 2102 of the wiring layer 210 is coupled to the second source drain layer 208 by using a via hole, so that the second electrode 209 of the first transistor 202 is coupled to the anode 205 of the light emitting device 104.

It should be understood that, when art under-screen camera (that is, a camera disposed under a display) is disposed in the electronic device, or when another special-form design area (for example, a circular arc corner (corner) at an edge of the electronic device) exists on the electronic device, after the second metal wire 2102 is disposed on the wiring layer 210, the anode 205 of the light emitting device 104 in that area may also be coupled to the second electrode 209 of the first transistor 202 by using the second metal wire 2102 and a via hole.

When the TFT substrate is applied to a large-size AM-OLED panel or an AM-OLED panel with relatively high power consumption, after the second metal wire 2102 of the wiring layer 210 is coupled to the second source drain layer 208 or to the second electrode 209 of the first transistor 202 by using a via hole, the wiring layer 210 may be configured to reduce load of a power wire in an AM-OLED panel and reduce a voltage drop (IR drop). When the TFT substrate is applied to an LCD panel, the second metal wire 2102 of the wiring layer 210 may be coupled to a common (common) electrode in the LCD panel, to optimize a problem of ghost (Ghost), brightness mura (mura), and bad loading (loading).

In conclusion, the wiring layer 210 is disposed in the TFT substrate, and the wiring layer 210 includes the first metal wire 2101 and the second metal wire 2102. This can effectively reduce the problem of display mura due to light reflection of a metal wire (for example, the first metal wire 2101) in the active area AA, and improve the display quality of the electronic device. In addition, load of the pixel circuit may be balanced, to improve display quality of the active area AA.

An embodiment of this application further provides a display module. The display module includes any one of the foregoing TFT substrates and a driver chip. The driver chip may include a display driver chip. The display driver chip is coupled to a data line of the TFT substrate. The display module has a same technical effect as the TFT substrate provided in the foregoing embodiment, and details are not described herein again.

An embodiment of this application further provides an electronic device. The electronic device includes a printed circuit board, a driver chip, and any one of the foregoing TFT substrates. The printed circuit board includes an application processor. The application processor is coupled to the driver chip. The driver chip includes a display driver chip. The display driver chip is coupled to a wiring layer in the TFT substrate. The electronic device has a same technical effect as the TFT substrate provided in the foregoing embodiment, and details are not described herein again.

The foregoing descriptions are merely specific implementations of this application, but the protection scope of this application is not limited thereto. Any person skilled in the art can easily conceive modifications or replacements within the technical scope of this application, and these modifications or replacements shall fall within the protection scope of this application. Therefore, the protection scope of this application shall be subject to the protection scope of the claims.

What is claimed is:

1. A thin film transistor (TFT) substrate having a plurality of sub-pixels arranged in rows and columns, the TFT substrate comprising:

a base;

a first active layer, disposed on a side of the base, wherein each of the sub-pixels comprises the first active layer;

a first source drain layer, disposed on a side of the first active layer, wherein the side of the first active layer is away from the base, wherein the first source drain layer comprises a first source or a first drain in a sub-pixel of the sub-pixels, and wherein the first source or the first drain is coupled to the first active layer in the sub-pixel;

a first gate, disposed between the first active layer and the first source drain layer; and a wiring layer, disposed on a side of the first source drain layer, wherein the side of the first source drain layer is away from the base, wherein the wiring layer overlaps the first source drain layer along a direction perpendicular to the first source drain layer, and wherein the wiring layer comprises a plurality of first metal wires, wherein the plurality of first metal wires form a first area on the TFT substrate, wherein the wiring layer further comprises a plurality of second metal wires disposed in a second area of the TFT substrate, wherein the second area is an area on the TFT substrate other than the first area, wherein the second metal wire is separated from the first metal wire, wherein the second metal wire is coupled to the first source drain layer, and wherein the second area and the first area are on a display area of the TFT substrate, wherein at least some of the first metal wires extend in a shape, wherein a first portion of the shape extends in a first direction and a second portion of the shape extends in a second direction, wherein the second direction is perpendicular to the first direction, wherein at least some of the second metal wires comprises a first sub-wire and second sub-wires, wherein the first sub-wire extends in the first direction, wherein at least some of the second sub-wires extend in the second direction and at least some of the second sub-wires extend in a third direction, wherein the third direction is opposite and parallel to the second direction, and wherein the at least some of the second sub-wires extend other than parallel to the first sub-wire from a position at which the at least some of the second sub-wires overlap with the first sub-wire.

2. The TFT substrate of claim 1, wherein different first metal wires among the plurality of first metal wires are separated from each other.

3. The TFT substrate of claim 1, wherein the display driver chip is disposed at an edge of a side of the TFT substrate, and each first metal wire extends in an "L" shape.

4. The TFT substrate of claim 1, wherein different second metal wires among the plurality of second metal wires are separated from each other.

5. The TFT substrate of claim 1, wherein at least some of the first metal wires extend in an "L" shape, at least some of the second metal wires comprise a first sub-wire and a second sub-wire, an extension direction of the first sub-wire is the same as that of one side of the "L" shape of the at least some of the first metal wires, and an extension direction of the second sub-wire is the same as that of the other side of the "L" shape of the at least some of the first metal wires.

6. The TFT substrate of claim 1, further comprising a light emitting device, disposed on a side of the wiring layer that is away from the base, wherein the light emitting device is coupled to the first source drain layer.

7. The TFT substrate of claim 6, further comprising a second source drain layer, disposed between the first source drain layer and the wiring layer, wherein the light emitting device is coupled to the first source drain layer by using the second source drain layer.

8. The TFT substrate of claim 1, further comprising a light emitting device, disposed on a side of the wiring layer, wherein the side of the wiring layer is away from the base, and wherein the light emitting device is coupled to the first source drain layer by using the second metal wire.

9. The TFT substrate of claim 8, further comprising a second source drain layer, disposed between the first source drain layer and the wiring layer, wherein the second source drain layer is coupled to the second metal wire.

10. A display module, comprising:

a display driver chip; and a thin film transistor (TFT) substrate having a plurality of sub-pixels arranged in rows and columns, the TFT substrate comprising:

a base;

a first active layer, disposed on a side of the base, wherein each of the sub-pixels comprises the first active layer;

a first source drain layer, disposed on a side of the first active layer, wherein the side of the first active layer is away from the base, wherein the wiring layer overlaps the first source drain layer along a direction perpendicular to the first source drain layer, and wherein the first source drain layer comprises a first source or a first drain in a sub-pixel of the sub-pixels, and the first source or the first drain is coupled to the first active layer in the sub-pixel;

a first gate, disposed between the first active layer and the first source drain layer; and a wiring layer coupled to the display driver chip, wherein the wiring layer is disposed on a side of the first source drain layer, wherein the side of the first source drain layer is away from the base, wherein the wiring layer overlaps the first source drain layer along a direction perpendicular to the first source drain layer, and wherein the wiring layer comprises a plurality of first metal wires, wherein the plurality of first metal wires form a first area on the TFT substrate, wherein the wiring layer further comprises a plurality of second metal wires disposed in a second area of the TFT substrate, wherein the second area is an area on the TFT substrate other than the first area, wherein the second metal wire is separated from the first metal wire, wherein the second metal wire is coupled to the first source drain layer, wherein the second area and the first area are on a display area of the TFT substrate, wherein at least some of the first metal wires extend in a shape, wherein a first portion of the shape extends in a first direction and a second portion of the shape extends in a second direction, wherein the second direction is perpendicular to the first direction, wherein at least some of the second metal wires comprises a first sub-wire and second sub-wires, wherein the first sub-wire extends in the first direction, wherein at least some of the second sub-wires extend in the second direction and at least some of the second sub-wires extend in a third direction, wherein the third direction is opposite and parallel to the second direction, and wherein the at least some of the second sub-wires extend other than parallel to the first sub-wire from a position at which the at least some of the second sub-wires overlap with the first sub-wire.

11. The TFT substrate of claim 1, wherein edges of the first metal wires and the second metal wires are evenly spaced from one another in the wiring layer.

12. The display module of claim 10, wherein at least some of the first metal wires extend in an "L" shape, at least some of the second metal wires comprise a first sub-wire and a second sub-wire, an extension direction of the first sub-wire is the same as that of one side of the "L" shape of the at least some of the first metal wires, and an extension direction of the second sub-wire is the same as that of the other side of the "L" shape of the at least some of the first metal wires.

13. The display module of claim 10, wherein the TFT substrate further comprises a light emitting device, disposed on a side of the wiring layer that is away from the base, wherein the light emitting device is coupled to the first source drain layer.

14. The display module of claim 13, wherein the TFT substrate further comprises a second source drain layer, disposed between the first source drain layer and the wiring layer, wherein the light emitting device is coupled to the first source drain layer by using the second source drain layer.

15. The display module of claim 10, wherein the display module comprises:

a plurality of data lines, disposed at the first source drain layer, wherein the plurality of data lines are respectively coupled to the first source or the first drain in a plurality of columns of sub-pixels;

and one end of a metal wire of the first metal wires is coupled to a data line of the data lines, and another end of the metal wire of the first metal wires is coupled to a display driver chip.

16. An electronic device, comprising:

a printed circuit board;

an application processor installed on the printed circuit board;

a display driver chip coupled to the application processor; and a thin film transistor (TFT) substrate comprising a wiring layer and having a plurality of sub-pixels arranged in rows and columns, wherein the display driver chip is coupled to the wiring layer in the TFT substrate, and wherein the TFT substrate comprises:

a base;

a first active layer, disposed on a side of the base, wherein each of the sub-pixels comprises the first active layer;

a first source drain layer, disposed on a side of the first active layer, wherein the side of the first active layer is away from the base, wherein the wiring layer overlaps the first source drain layer along a direction perpendicular to the first source drain layer, and wherein the first source drain layer comprises a first source or a first drain in a sub-pixel of the sub-pixels, and the first source or the first drain is coupled to the first active layer in the sub-pixel;

a first gate, disposed between the first active layer and the first source drain layer; and a wiring layer coupled to the display driver chip, the wiring layer disposed on a side of the first source drain layer and the side of the first source drain layer is away from the base, wherein the wiring layer overlaps the first source drain layer along a direction perpendicular to the first source drain layer, and wherein the wiring layer comprises a plurality of first metal wires, wherein the plurality of first metal wires form a first area on the TFT substrate, wherein the wiring layer further comprises a plurality of second metal wires disposed in a second area of the TFT substrate, wherein the second area is an area on the TFT substrate other than the first area, wherein and the second metal wire is separated from the first metal wire, wherein the second metal wire is coupled to the first source drain layer, wherein the second area and the first area on a display area of the TFT substrate, wherein at least some of the first metal wires extend in a shape, wherein a first portion of the shape extends in a first direction and a second portion of the shape extends in a second direction, wherein the second direction is perpendicular to the first direction, wherein at least some of the second metal wires comprises a first sub-wire and second sub-wires, wherein the first sub-wire extends in the first direction, wherein at least some of the second sub-wires extend in the second direction and at least some of the second sub-wires extend in a third direction, wherein the third direction is opposite and parallel to the second direction, and wherein the at least some of the second sub-wires extend other than parallel to the first sub-wire from a position at which the at least some of the second sub-wires overlap with the first sub-wire.

17. The electronic device of claim 16, wherein at least some of the first metal wires extend in an "L" shape, at least some of the second metal wires comprise a first sub-wire and a second sub-wire, an extension direction of the first sub-wire is the same as that of one side of the "L" shape of the at least some of the first metal wires, and an extension direction of the second sub-wire is the same as that of the other side of the "L" shape of the at least some of the first metal wires.

18. The electronic device of claim 16, wherein the TFT substrate further comprises a light emitting device, disposed on a side of the wiring layer that is away from the base, wherein the light emitting device is coupled to the first source drain layer.

19. The electronic device of claim 18, wherein the TFT substrate further comprises a second source drain layer, disposed between the first source drain layer and the wiring layer, wherein the light emitting device is coupled to the first source drain layer by using the second source drain layer.

* * * * *